United States Patent [19]

Inoue et al.

[11] Patent Number: 5,783,951
[45] Date of Patent: Jul. 21, 1998

[54] SMALL CURRENT DETECTOR CIRCUIT AND LOCATOR DEVICE USING THE SAME

[75] Inventors: Kinya Inoue, Tokyo; Akitoshi Watanabe; Mitsuharu Iwasaki, both of Ukyo; Mikio Matsumoto, deceased, late of Iwaki, all of Japan, by Taeko Matsumoto, heir

[73] Assignees: Rohm Co., Ltd., Kyoto; Alps Electric Co., Ltd., Tokyo, both of Japan

[21] Appl. No.: 728,382

[22] Filed: Oct. 9, 1996

[30] Foreign Application Priority Data

Oct. 12, 1995 [JP] Japan ................... 7-289218

[51] Int. Cl.$^6$ ................... G01R 19/00
[52] U.S. Cl. ................... 327/52; 327/53; 327/96; 327/563
[58] Field of Search ................... 327/53, 66, 91, 327/94, 96, 103, 361, 560, 561, 562, 563, 51, 52; 324/522

[56] References Cited

U.S. PATENT DOCUMENTS 4,649,301 3/1987 Van Tran ................... 327/53
5,552,729 9/1996 Deguchi ................... 327/563

Primary Examiner—Timothy P. Callahan
Assistant Examiner—Jeffrey Zweizig
Attorney, Agent, or Firm—Fay, Sharpe, Beall, Fagan, Minnich & McKee

[57] ABSTRACT

Improved small current detector circuit and locator device each comprise a first and a second element in both of which a small current output occurs, a first and a second constant current generator circuit each generating a specified constant current, a first current mirror circuit which is supplied at the input with said output current occurring in said first element and said specified constant current generated from said first constant current generator circuit, and a second current mirror circuit which is supplied at the input with said output current occurring in said second element and said specified constant current generated from said second constant current generator circuit, and wherein either one of said first and second elements is disposed in a detecting portion and a current equal to the current from the output of either one of said first and second current mirror circuits is flowed to the output of the other current mirror circuit such that a detection output corresponding to the difference between said output currents from said first and second elements is drawn from said other current mirror circuit.

10 Claims, 4 Drawing Sheets

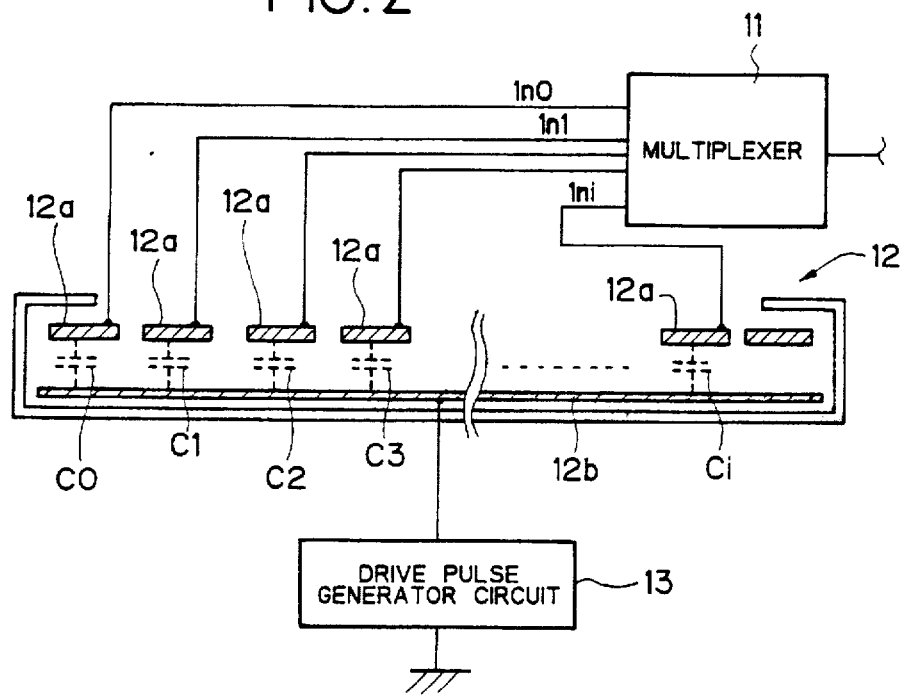
FIG. 2
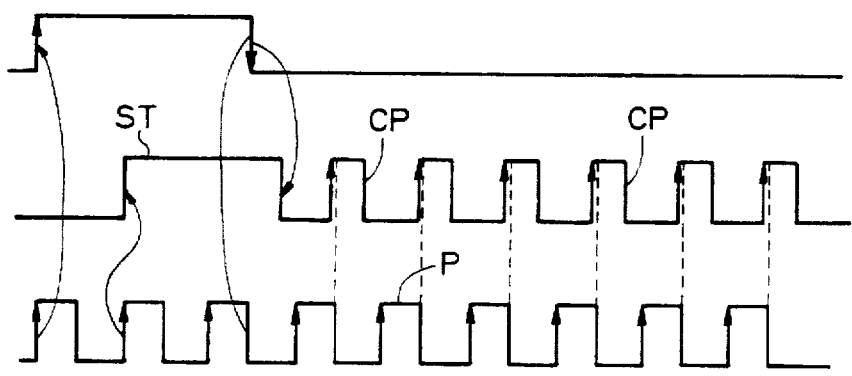
FIG. 3 (a) RESET PULSE RS
FIG. 3 (b) CONTROL PULSE CONT
FIG. 3 (c) DRIVE PULSE P

SMALL CURRENT DETECTOR CIRCUIT AND LOCATOR DEVICE USING THE SAME

BACKGROUND OF THE INVENTION

This invention relates to a small current detector circuit and a locator device (e.g. a tablet) that uses it. More particularly, the invention relates to a circuit for detecting small currents that are generated from capacitive or electrostatic sensors such as capacitive position sensors, piezoelectric sensors, capacitive humidity sensors, static field sensors, electrostatic digitizers and locator devices. The invention specifically relates to a small current detector circuit of a type that operates upon the difference between the electric currents flowing through a reference device and a detecting device.

A prior art small current detector circuit for use with capacitive or electrostatic sensors is shown in FIG. 5 and may be described as an electrostatic sensor circuit, or a charge current detector circuit for detecting the charge current generated upon charging of a capacitor.

Referring to FIG. 5, the charge current detector circuit which is generally indicated by 9 has an electrostatic position sensor portion 1 having two capacitors Ca and Cb, one of which (Ca in the case under consideration) serves as a charge current detecting sensor, or a so-called "touch" sensor, having a surface that can be touched from the outside. The detector circuit 9 also includes a pulse drive circuit 2 which applies drive pulses to either terminal of each capacitor at specified periods. The other of the terminals of capacitors Ca and Cb are connected to the inverting inputs of operational amplifiers (OP) 3 and 4, respectively.

The operational amplifiers 3 and 4 are each an inverting amplifier, with its non-inverting input being connected to the ground. The output voltages VA and VB of the respective operational amplifiers are fed back to the inverting inputs via feedback capacitors C3 and C4. Initializing switches 5 and 6 are provided parallel to respective capacitors C3 and C4. Prior to a detecting operation, these switch circuits are turned on for a specified period in response to a control signal as from a controller or the like.

The output voltage VB of operational amplifier 4 is supplied via a resistor R to the inverting input of a buffer amplifier 7 which is capable of inverted amplification. The amplifier 7 has a feedback resistor R which is equal in value to the resistor R provided between the output of operational amplifier 4 and the inverting input of said amplifier 7, whereby the amplification factor of the buffer amplifier 7 is adjusted to unity. Hence, the output voltage VB of operational amplifier 4 is simply inverted to produce a negative voltage signal −VB, which is delivered as an output voltage from the amplifier 7.

The output voltage (−VB) of buffer amplifier 7 and the output voltage (VA) of operational amplifier 3 are summed in an adder 8 which is capable of inverted amplification. Since the buffer amplifier 7 produces an output which is an inversion of the output from the operational amplifier 4, what actually occurs is the substraction of the output (VB) of operational amplifier 4 from the output voltage VA of operational amplifier 3, with −(VA−VB) being produced as an output from the adder 8. In the circuit configuration described above, when a difference occurs between the capacitances of capacitors Ca and Cb, the quantity of the charge building up in one capacitor becomes different from that in the other capacitor, creating a difference in the flowing charging current. In response to this difference, a detection signal will accordingly be obtained at the output of the adder 8.

The detecting operation is the same irrespective of whether it is accomplished by the operational amplifier 3 or 4 and, hence, the following description concerns only the operational amplifier 3. First, a switch circuit 5 is turned on for a specified period in the initial state. Since the inverting and non-inverting inputs of the operational amplifier 3 are virtually shorted, the turning on of the switch circuit 5 causes the output of the operational amplifier 5 to drop to the ground level (GND). As a result, the capacitor C3 is cleared by being discharged. At the same time, the capacitor Ca is similarly cleared by being discharged via the pulse drive circuit 2.

When the switch circuit 5 is turned off, a pulse signal is synchronously sent from the pulse drive circuit 2 to both capacitors Ca and Cb. The pulse signal passing through the capacitor Ca is applied to the inverting input of the operational amplifier 3, whereupon a current for charging the capacitor Ca flows in the path and thereby charges the capacitor Ca. The current flowing to the inverting input of the operational amplifier 3 is in proportion to the resulting charge buildup in the capacitor Ca. At the same time, a voltage output capable of holding the inverting input of the operational amplifier 3 at the ground potential develops at its output. In response to this output voltage, an electric current flows through the capacitor C3 to charge it. Since this charging operation occurs in such a direction that the operational amplifier 3 produces a negative output, the polarity of the capacitor C3 is as shown in FIG. 5, with the terminal to the inverting input of the operational amplifier 3 being positive and the terminal to the output being negative. As a consequence, the operational amplifier 3 produces the output voltage VA. Similarly, the operational amplifier 4 produces the output voltage VB.

Assume here that capacitor Ca is disposed in a specified detecting position and that its capacitance is changed by being touched by the operator or as the result of a metal coming close to it. If the capacitance of capacitor Cb does not change since it is a reference capacitor, the adder 8 provides an output signal of a voltage level in inverse proportion to the change in the capacitance of the capacitor Ca. Thus, one can detect the touching of the capacitor Ca or the change in the position of the target.

Electrostatic digitizers, locator devices and other sensors typically employ the above-described charge current detector circuit as a basic circuit and comprise a matrix array of capacitors Ca each having an electrode that can be touched by the operator. The individual detecting capacitors Ca are sequentially selected by scanning with a multiplexer. The change in the capacitance of a selected capacitor that occurs relative to the reference capacitor as a result of touching or other events is detected in the manner just described above. Thus, the position of locating by touching or other events can be detected on the basis of multiplexer selection timing and the change in the capacitance of the selected capacitor. In sensors of the type under consideration, operational amplifier 3 is provided for each of the detecting capacitors Ca. In practice, the multiplexer does not select a particular detecting capacitor but the outputs of operational amplifiers 3 are successively selected in a timed sequence.

In a charge current detector circuit having a detecting capacitor and a capacitor of a reference capacitance, the detecting capacitor (Ca in FIG. 5) is usually provided in the detecting position, so it is wired to the operational amplifier 3 over a long distance. As a result, the capacitance of the capacitor Ca which is about less than a hundred pF is highly sensitive to noise and the detected voltage will fluctuate to increase the chance of erroneous detection. In addition, the dynamic range of the detectable voltage is small since the change in an electric current to be detected is no greater than what develops in response to the change in capacitance due to an environmental change such as occurs when the operator touches the capacitor or if a metal object comes close to it. If the change in current is to be picked up by the operational amplifier, the offset of its operation will be a problem to the detecting operation.

SUMMARY OF THE INVENTION

An object, therefore, of the invention is to solve the aforementioned problems of the prior art by providing a small current detector circuit that is less affected by noise.

Another object of the invention is to provide a locator device having such a small current detector circuit that is less affected by noise.

The first object of the invention can be attained by a small current detector circuit comprising a first and a second element in both of which a small current output occurs, a first and a second constant current generator circuit each generating a specified constant current, a first current mirror circuit which is supplied at the input with said output current occurring in said first element and said specified constant current generated from said first constant current generator circuit, and a second current mirror circuit which is supplied at the input with said output current occurring in said second element and said specified constant current generated from said second constant current generator circuit, and wherein either one of said first and second elements is disposed in a detecting portion and a current equal to the current from the output of either one of said first and second current mirror circuits is flowed to the output of the other current mirror circuit such that a detection output corresponding to the difference between said output currents from said first and second elements is drawn from said other current mirror circuit.

The second object of the invention can be attained by a locator device which comprises the above-described small current detector circuit such that said first and second elements are capacitors and that the capacitor disposed in said detecting portion comprises an array of capacitors.

In the small current detector circuit of the invention, a constant current is applied as a bias current to each current mirror circuit and a small current to be detected is additionally supplied to the current mirror circuit. As a result, the whole circuitry is operated by current drive and, hence, is satisfactorily protected against noise. What is more, the current driven circuit is realized by current mirror circuits rather than by operational amplifiers and, hence, is free from the "offset" problem.

A particular advantage is that if capacitors are provided at the output and reset each time of detection, even a very small current output can be correctly measured and detected.

BRIEF DESCRIPTION OF THE DRAWINGS

FIG. 2 is a schematic of the configuration of the electrostatic sensor portion of the locator device;

FIG. 3 is a timing chart for various signals including the control signal generated from the control circuit shown in FIG. 1;

DESCRIPTION OF THE PREFERRED EMBODIMENTS

The preferred embodiments of the invention will now be described with reference to accompanying drawings.

Figure 1:
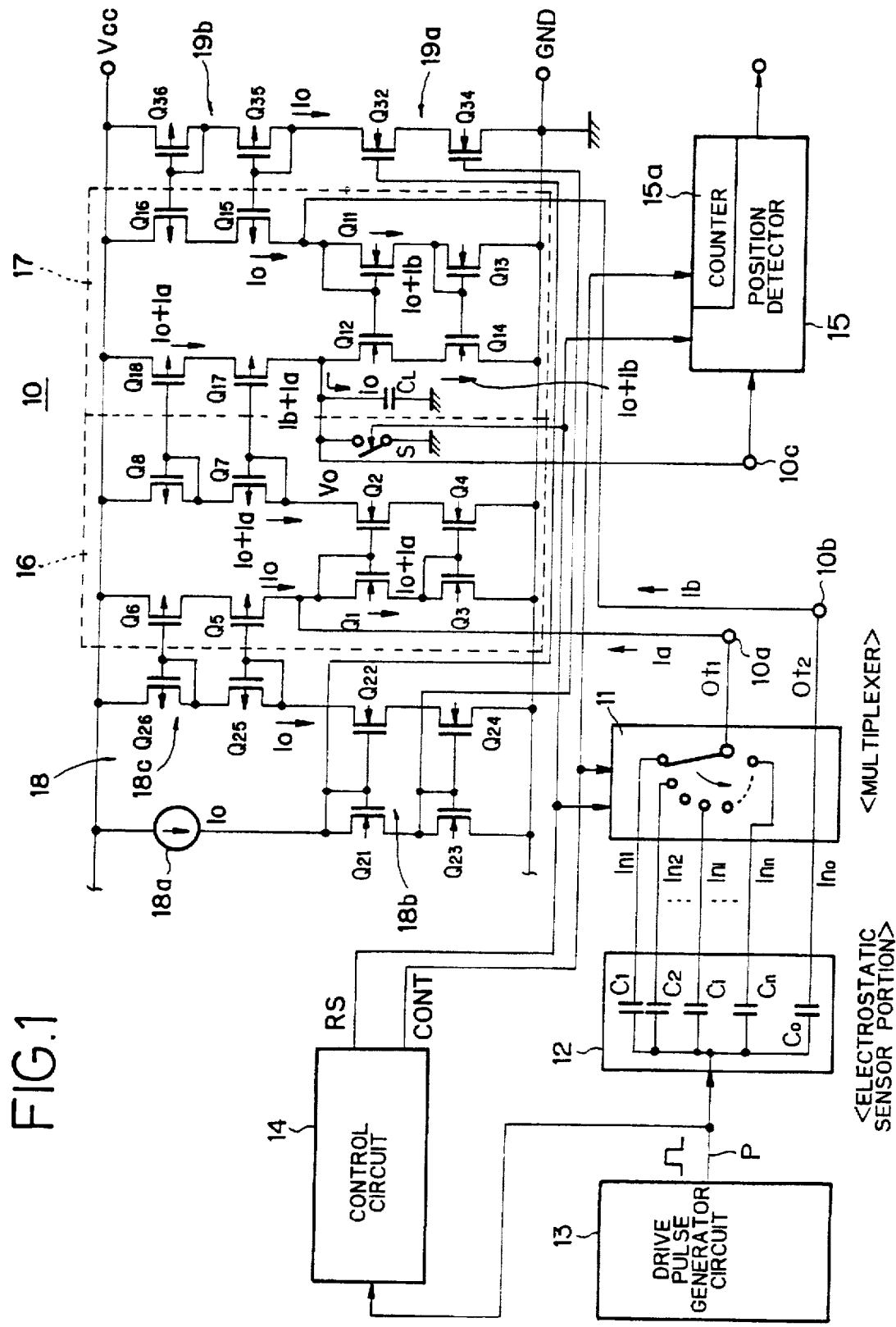
FIG. 1 is a schematic of a locator device which employs a small current detector circuit according to an embodiment of the present invention.

FIG. 1 is a schematic of a locator device employing a small current detector circuit according to an embodiment of the invention. The locator device comprises basically the small current detector portion 10, a multiplexer 11, an electrostatic sensor portion 12, a drive pulse generator circuit 13, a control circuit 14 and a position detector circuit 15. The electrostatic sensor portion 12 is shaped like a flat plate and, as shown by cross section in FIG. 2, it comprises capacitors C1, C2, Ci, . . . , Cn each being composed by providing touch plates, and a reference capacitor Co. The respective touch plates are rectangular metal plates 12a which form a matrix array on the obverse surface of the flat plate. A single large metal plate 12b is positioned a specified distance apart from the undersides of the metal plates 12a, with a spacer (not shown) being interposed. The respective rectangular metal plates 12 form the individual capacitors together with the underlying metal plate 12b.

The position detector circuit 15 has a counter 15a and, receiving an output pulse from the control circuit 14 and an output from the small current detector portion 10, the circuit 15 detects the position of the touch plate (capacitor) being touched. The detecting procedure is as follows. Receiving a reset pulse RS from the control circuit 14, the counter 15a is reset; then, receiving a start pulse ST (see the control pulse CONT at FIG. 3b), the counter starts to count the number of change pulses CP. The counter 15a stops counting in accordance with the generation of an output from the small current detector circuit 10 and outputs the so far obtained count as position data. As shown in FIG. 3b, the control pulse CONT consists of the start pulse ST and the subsequent change pulses CP. The number of change pulses CP that are generated is equal to the number of capacitors C1, C2, Ci, . . . , Cn.

As shown in FIG. 2, the capacitors C1, C2, Ci, . . . , Cn are connected at an end (i.e., the underlying metal plate 12b) to a common output of the drive pulse generator circuit 13 so that they receive drive pulses P of a predetermined width (see FIG. 3c) at specified periods. The capacitors C1, C2, Ci, . . . , Cn have leads at the other end (i.e. touch plates 12a) that are wired for connection to input terminals In1, In2, . . . . Inn, respectively, of the multiplexer 11. Responding to each of change pulses CP and a reset pulse RS from the control circuit 14, the multiplexer 11 first turns on a switch for shorting both ends of each of the capacitors C1, C2, Ci, . . . , Cn and Co, whereupon these capacitors discharge to a reset condition. Starting with the application of a start pulse ST and upon each reception of the leading edge of a change pulse CP, the multiplexer 11 changes the output terminal of capacitor C1 for the terminals of the successive capacitors C2, Ci, . . . , Cn such that the outputs of the respective capacitors are connected sequentially to the input terminals of the multiplexer 11. As a result, the input terminals In1, In2, . . . Inn connected from the respective capacitors C1, C2, Ci, . . . , Cn are sequentially selected one at a time and connected to an output terminal Ot1 of the multiplexer 11. The other end of the capacitor Co is connected to the input terminal Ino and thence coupled directly to an output terminal Ot2.

The output terminals Ot1 and Ot2 of the multiplexer 11 are connected to corresponding input terminals 10a and 10b, respectively, of the small current detector portion 10 so that the respective outputs of the multiplexer 11 are supplied to the detector portion 10 at these inputs 10a and 10b.

In synchronism with drive pulses P supplied from the drive pulse generator circuit 13, the control circuit 14 generates a number of change pulses CP as well as a start pulse ST which dictates the start point of the generation of change pulses CP. Each change pulse CP falls a little before the next drive pulse P is generated whereas it rises a little before the drive pulse P falls. Thus, the control circuit 14 performs sequential changes of the connection to the inputs of the multiplexer 11 a little before successive drive pulses P fall (see FIG. 3b) and resets the capacitors C1–Cn and Co in response to each of change pulses CP. In synchronism with the drive pulse P, the control circuit 14 also sends a reset pulse RS (see FIG. 3a) to each of the multiplexer 11, the small current detector portion 10 and the position detector circuit 15; the reset pulse is a control signal for resetting these circuit components.

When the electrostatic sensor portion 12 is touched in a certain area, a current output (which is hereunder referred to as "a charge current output") is generated in proportion to the capacitance of the capacitor in that area (the charge buildup in that capacitor) and delivered to Ot1 via a selected input of the multiplexer 11. This output is sent to the terminal 10a of the small current detector portion 10. At the same time, the charge current output of capacitor Co is also sent via the output terminal Ot2 of the multiplexer 11 to the other terminal 10b of the small current detector portion 10.

The small current detector portion 10 comprises two current mirror circuits 16 and 17 of a CMOS configuration that are connected together in a current mirror fashion. These current mirror circuits 16 and 17 serve to produce a detection signal representing the difference between the two charge current outputs described in the preceding paragraph. The current mirror circuits 16 and 17 are supplied with constant currents from respective constant current generator circuits 18 and 19. The constant currents generated by these circuits 18 and 19 are respectively sent to the current mirror circuits 16 and 17 as bias currents and the values of electric current due to the aforementioned charge current outputs are respectively added to those bias currents, whereby an output is produced at the output terminal 10c of the current mirror circuit 17.

In the current mirror circuit 16, two diode-connected output transistors Q7 and Q8 have their bases connected to the respective bases of two output transistors Q17 and Q18 in the current mirror circuit 17. Because of this "current mirror connection", the current at the output of the current mirror circuit 16 is directly transmitted as the current at the output of the current mirror circuit 17 so that a current of an equal value to the output from the current mirror circuit 16 is generated at the output of the current mirror circuit 17. Hence, the difference between the transmitted current and the output current into the current mirror circuit 17 will be produced from the latter. Details of this operation will be described hereinafter.

It should be mentioned here that the small current detector portion 10 has a circuit configuration which is symmetric with respect to the CMOS current mirrors created by transistors Q7/Q8 and Q17/Q18. It should also be noted that an output Vo of the small current detector portion 10 is drawn from the output terminal 10c connected to the drain of output transistor Q17 in the current mirror circuit 17.

Connected between the output terminal 10c and the ground GND is a load capacitor CL for picking up the detection output as a voltage. A reset switch S for resetting the load capacitor CL by discharging it is provided parallel with said load capacitor. The reset switch S is turned on for a specified period in response to a reset pulse S (see FIG. 3) from the control circuit 14, thereby discharging the capacitor CL.

Current mirror circuit 16 is composed of a pair of N-type FETs (field-effect transistors) Q1 and Q2 that are connected together in a current mirror configuration and which are stacked on a downstream pair of N-type FETs Q3 and Q4 which are also connected together in a current mirror configuration. Transistors Q1 and Q3 are diode-connected input transistors and transistors Q2 and Q4 are output transistors. The sources of transistors Q3 and Q4 are each connected to the ground GND. The drain of the upstream transistor Q1 is connected to a supply line Vcc via two further upstream P-type FETs Q5 and Q6 and, similarly, the drain of the upstream transistor Q2 is connected to the supply line Vcc via two further upstream P-type FETs Q7 and Q8. The drain of the transistor Q1 is also connected to the input terminal 10a, which receives via multiplexer 11 the charge current output from the capacitor Ca in the touched area.

Current mirror circuit 17 is composed in a similar manner to the current mirror circuit 16 such that a pair of N-type FETs Q11 and Q12 connected together in a current mirror configuration are stacked on a downstream pair of N-type FETs Q13 and Q14 which are also connected in a current mirror configuration. Transistors Q11 and Q13 are diode-connected input transistors and transistors Q12 and Q14 are output transistors. The sources of transistors Q13 and Q14 are each connected to the ground GND. The drain of the upstream transistor Q11 is connected to the supply line Vcc via two further upstream P-type FETs Q15 and Q16 and, similarly, the drain of the upstream transistor Q12 is connected to the supply line Vcc via two further upstream P-type FETs Q17 and Q18. The drain of the transistor Q11 is also connected to the input terminal 10b, which receives the charge current output from the reference capacitor Co.

The constant current generator circuit 18 is composed of three portions, a constant current source 18a that is connected to the supply line Vcc for providing a current Io, a current mirror circuit 18b, and an output circuit 18c connected as a current mirror for transmitting a constant current to the current mirror circuit 16.

The current mirror circuit 18b is composed of a pair of N-type FETs Q21 and Q22 that are connected together in a current mirror configuration and which are stacked on a downstream pair of N-type FETs Q23 and Q24 which are also connected together in a current mirror configuration. Transistors Q21 and Q23 are diode-connected input transistors and transistors Q22 and Q24 are output transistors. The sources of transistors Q23 and Q24 are each connected to the ground GND. The drain of transistor Q21 is connected via the constant current source 18a to the supply line Vcc for receiving the constant current Io. The drain of transistor Q22 is also connected to the supply line Vcc via two further upstream diode-connected P-type FETs Q25 and Q26 in the output circuit 18c. The bases of the two P-type FETs Q25 and Q26 are connected to the bases of transistors Q5 and Q6 which are positioned upstream of the input transistors in the current mirror circuit 16, whereby transistors Q25 and Q26 compose current mirrors in combination with transistors Q5 and Q6. As a result, the constant current Io flowing through transistors Q25 and Q26 is generated in transistors Q5 and Q6 in current mirror circuit 16 to serve as a bias current at the input of the latter.

The constant current circuit 19 is composed of two portions, a current mirror circuit 19a connected to the current mirror circuit 18b in the constant current circuit 18 to provide a current mirror configuration, and an output circuit 19b which is connected as a current mirror for transmitting a constant current to the current mirror circuit 17.

The current mirror circuit 19a is composed of output N-type FETs Q32 and Q34 which are connected in a current mirror configuration to the transistors Q21 and Q23, respectively, in the current mirror circuit 18b that are supplied with a constant input current and which are stacked upstream of the transistors Q32 and Q34. This arrangement causes the constant current Io to be transmitted from the current mirror circuit 18b to the current mirror circuit 19a.

The drain of the upper transistor Q32 is connected to the supply line Vcc via two diode-connected P-type FETs Q35 and Q36 in the output circuit 19b which is disposed upstream of said transistor Q32. The bases of the two P-type FETs Q35 and Q36 are connected to the bases of transistors Q15 and Q16 in the current mirror circuit 17, whereby transistors Q35 and Q36 compose a current mirror in combination with transistors Q15 and Q16.

As a result, the constant current Io flowing through input transistors Q21 and Q23 is transmitted to transistors Q32 and Q34 and thence flowed through upstream transistors Q35 and Q36. This constant current Io is further transmitted to transistors Q15 and Q16 in the current mirror circuit 17, through which it flows to serve as a bias current at the input of said current mirror circuit.

The operation of the small current detector portion 10 will now be described. The constant current Io generated by the constant current source 18a is transmitted by the current mirror circuit 18b to the output circuits 18c and 19b. The transistor pair Q5 and Q6 which are connected to the output circuit 18c in a current mirror configuration, as well as the transistor pair Q15 and Q16 which are connected to the output circuit 19b in a current mirror configuration are both supplied with constant current Io from the supply line Vcc.

The constant current Io flowing through transistors Q5 and Q6 is applied as an input current sinking into the input transistor Q1 which is connected with the transistor Q2 in a current mirror fashion; the constant current Io is further applied as an input current sinking into the downstream input transistor Q3 which is connected with the transistor Q4 in a current mirror fashion. The constant current Io then flows through the output transistors Q2 and Q4 to be supplied as an output current into the transistors Q7 and Q8 in the current mirror circuit 16. Similarly, the constant current Io flowing into the transistors Q15 and Q16 further flows through the transistor pair Q11 and Q12 connected in a current mirror configuration and through the downstream transistor pair Q13 and Q14 also connected in a current mirror configuration and thence flows as an output current into the transistors Q17 and Q18 in the current mirror circuit 17.

As a result, the drain of the transistor Q17 connected to the output terminal 10c is supplied with the current Io which is transmitted from the transistors Q7 and Q8 connected in a current mirror configuration and which thereafter flows into the drain of the downstream transistor Q12. Since the value of the current flowing at the drain of the transistor Q12 is set at Io by means of the transistors Q11 and Q13 connected in a current mirror configuration, all the currents flowing in upstream positions are allowed to sink into the transistors Q12 and Q14. As a result, no current will flow to the output terminal 10c and, hence, the small current detector portion 10 is in a balanced state.

Assume here that a current Ia is generated as a charge current output at the input terminal 10a whereas a current Ib is generated as a charge current output at the input terminal 10b. The current Ia is supplied to the drain of transistor Q1 at the input of the current mirror circuit 16, with the result that the value of the input current flowing through the transistor Q1 is equal to Io+Ia. As a result, the current Io+Ia. As a result, the current Io+Ia flows into transistors Q7 and Q8, from which it is transmitted into the transistors Q17 and Q18 in the current mirror circuit 17 so that the current Io+Ia will flow through these transistors.

The current Ib which has been generated as a charge current output at the input terminal 10b is supplied to the drain of transistor Q11 at the input of the current mirror circuit 17, with the result that the value of the input current flowing through the transistor Q11 is equal to Io+Ib. As a result, the current Io+Ib flows into transistors Q11 and Q13, from which it is transmitted into the transistors Q12 and Q14 in the current mirror circuit 17, causing a corresponding sink in the current flowing through the upstream transistors Q17 and Q18.

As a result, a differential current equal to Io+Ia−(Io +Ib) flows to the output terminal 10c; eventually, a net current of Ia−Ib flows to the output terminal 10c and thereby charges the load capacitor CL. A voltage corresponding to the differential current Ia−Ib will then develop across the capacitor, yielding a detection voltage signal at the output terminal 10c.

If a certain capacitor is touched, a difference will accordingly occur between the amounts of electricity for Ia and Ib. The resulting voltage is obtained as a detection signal at the output terminal 10c, which is then supplied to the position detector circuit 15. In response to a specified level of detection output that has been delivered to the output terminal 10c, the position detector circuit 15 stops counting the number of change pulses CP being supplied from the control circuit 14, decodes the so far obtained count as a position signal indicating which capacitor has been selected, and outputs said position signal to an external circuit.

Figure 4:
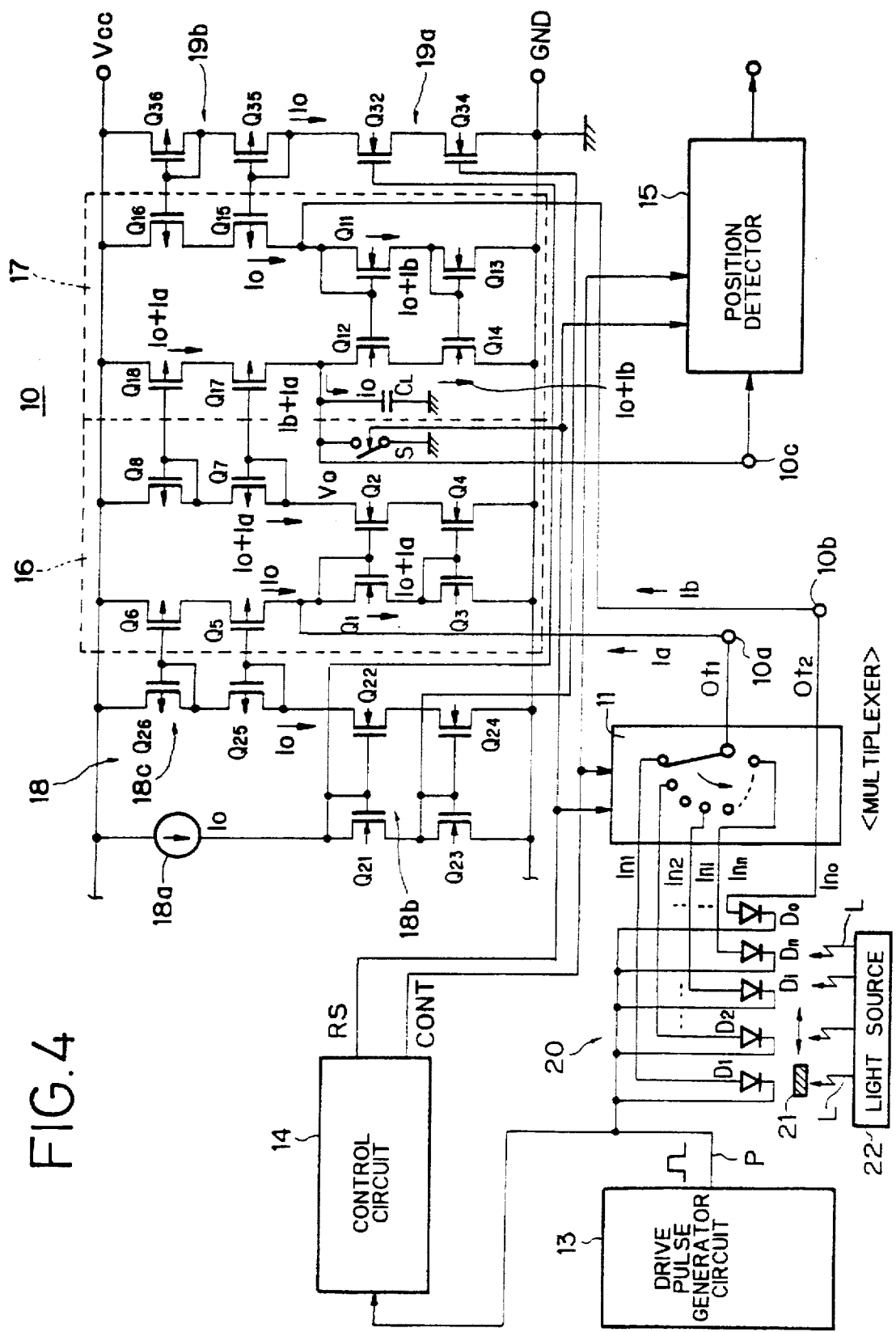
FIG. 4 is a schematic of a position detector device which performs position detection with light receiving elements in a small current detector circuit according to another embodiment of the invention.
Figure 5:
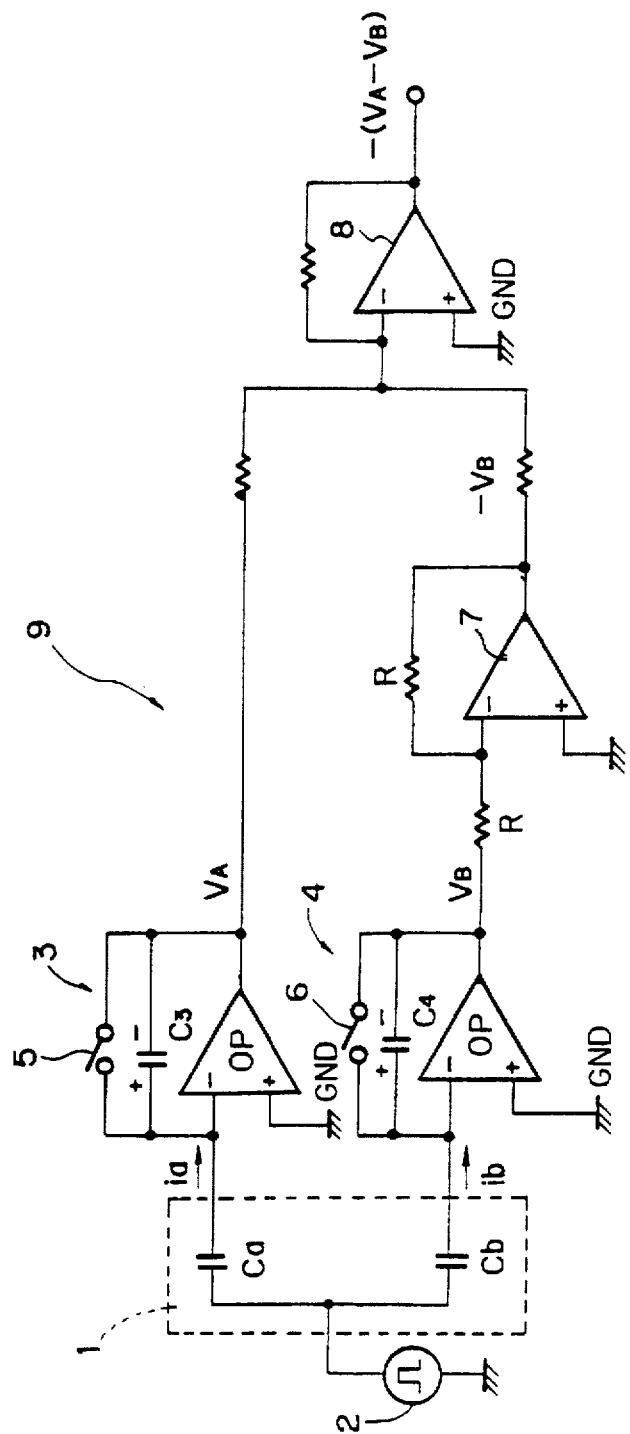
FIG. 5 shows a charge current detector circuit which is an example of the prior art small current detector circuit.

FIG. 4 shows another preferred embodiment of the invention which is identical to the small current detector circuit shown in FIG. 1, except that the electrostatic sensor portion 12 comprising capacitors C1, C2, . . . , Ci, . . . , Cn and the reference capacitor Co is replaced by a position detecting sensor portion 20 comprising photodiodes D1, D2, . . . . , Di, Dn and a reference photodiode Do, respectively. The position detecting sensor portion 20 is such that a bar 21 to be detected blocks the illumination from a light source 22, whereupon one of the photodiodes D1−Dn is prevented from light reception and the resulting decrease in the output current flowing through that particular photodiode is detected. Operational details of the small current detector portion shown in FIG. 4 are essentially the same as described in connection with the first embodiment and, hence, will not be repeated here.

In the foregoing description, the current values Ia and Ib are assumed to represent the quantities of electricity flowing into the small current detector portion 10 but it should of course be understood that those current values may be such that electric charges to be compared with each other flow out of the small current detector portion 10.

The current mirror circuits need not be composed of FETs but may be composed of bipolar transistors.

Each of the current mirror circuits shown in the preferred embodiments consists of transistor combinations that are stacked in two stages to provide a dual current mirror system and this is in order to realize a circuit in which a small bias current suffices to ensure stable operations with reduced errors. If the supply voltage is sufficiently low, each of the current mirror circuits to be employed in the invention may consist of a single stage of transistor combinations.

What is claimed is:

1. A small current detector circuit comprising a first and a second element in both of which a small current output occurs, a first and a second constant current generator circuit each generating a specified constant current, a first current mirror circuit which is supplied at the input with said output current occurring in said first element and said specified constant current generated from said first constant current generator circuit, and a second current mirror circuit which is supplied at the input with said output current occurring in said second element and said specified constant current generated from said second constant current generator circuit, and wherein either one of said first and second elements is disposed in a detecting portion and a current equal to the current from the output of either one of said first and second current mirror circuits is flowed to the output of the other current mirror circuit such that a detection output corresponding to the difference between said output currents from said first and second elements is drawn from said other current mirror circuit.

2. A small current detector circuit according to claim 1, wherein the other of said first and second elements which is not disposed in said detecting portion outputs a reference current, said inputs of said first and second current mirror circuits are sinks for current, and the current at the output of either one of said first and second current mirror circuits is flowed via a third current mirror circuit to the output of said other current mirror circuit.

3. A small current detector circuit according to claim 2, wherein said first and second elements are capacitors, said small current output is a charging current generated by charging said first and second elements in response to a pulse signal for a specified period, and said specified constant current is a bias current that sets said first and second mirror current circuits in a balanced state.

4. A small current detector circuit according to claim 3, wherein said first, second and third current mirror circuits and said first and second constant current generator circuits are each composed of field-effect transistors and said other current mirror circuit is provided at the output with a capacitor as a load from which said detection output is to be drawn.

5. A small current detector circuit according to claim 4, wherein each of said first, second and third current mirror circuits comprises field-effect transistors stacked in two stages and said load capacitor is provided with a switch circuit for discharging it.

6. A small current detector circuit according to claim 2, wherein said first and second elements are light-receiving elements and said small current output is generated by illuminating said first and second elements with light.

7. A locator device comprising a small current detector circuit comprising a first and a second capacitor in both of which a charge current output occurs, a first and a second constant current generator circuit each generating a specified constant current, a first current mirror circuit which is supplied at the input with said charge current output occurring in said first capacitor and said specified constant current generated from said first constant current generator circuit, and a second current mirror circuit which is supplied at the input with said charge output current occurring in said second capacitor and said specified constant current generated from said second constant current generator circuit, and wherein either one of said first and second capacitors is disposed in a detecting portion and a current equal to the current from the output of either one of said first and second current mirror circuits is flowed to the output of the other current mirror circuit such that a detection output corresponding to the difference between said output currents from said first and second capacitors is drawn from said other current mirror circuit, with the capacitor disposed in said detecting portion comprising an array of capacitors.

8. A locator device according to claim 7, wherein each of the capacitors disposed in said detecting portion is composed of two electrodes one of which is a plate to be touched, said device further including a multiplexer having a plurality of said plates connected respectively to a plurality of selection terminals, and wherein the capacitor not disposed in said detecting portion generates a reference charge current output, a common pulse signal being supplied to the other of the electrodes defining each of the capacitors disposed in said detecting portion, and the output of said multiplexer being supplied into either one of said first and second current mirrors as said charge current output while said reference charge current output is supplied to the other of said first and second current mirror circuits.

9. A locator device according to claim 8, wherein said inputs of said first and second current mirror circuits are sinks for current, and the current at the output of either one of said first and second current mirror circuits is flowed via a third current mirror circuit to the output of said other current mirror circuit whereas said specified constant current is a bias current that sets said first and second current mirror circuits in a balanced state.

10. A locator device according to claim 9, wherein said charge current output is generated by charging said first and second capacitors, and said first, second and third current mirror circuits and said first and second constant current generator circuits are each composed of field-effect transistors and wherein said other current mirror circuit is provided at the output with a capacitor as a load from which said detection output is drawn.

* * * * *